United States Patent [19]

Dyer

[11] Patent Number: 4,908,787
[45] Date of Patent: Mar. 13, 1990

[54] INTERPOLATOR/DECIMATOR FILTER STRUCTURE AND A NOTCH FILTER THEREFOR

[75] Inventor: Nigel P. Dyer, London, England

[73] Assignee: Plessey Overseas Limited, Ilford, England

[21] Appl. No.: 894,994

[22] Filed: Aug. 8, 1986

[30] Foreign Application Priority Data

Aug. 28, 1985 [GB] United Kingdom ............... 8521377

[51] Int. Cl.$^4$ ..................... G06F 15/31; H03H 17/04
[52] U.S. Cl. ............................ 364/724.10; 364/724.01
[58] Field of Search ................... 364/724, 723, 724.01, 364/724.10; 333/203

[56] References Cited

U.S. PATENT DOCUMENTS 4,694,414  9/1987  Christopher .................... 364/724

OTHER PUBLICATIONS

"Efficient Sampling Rate Alteration Using Recursive (IIR) Digital Filters", by R. Ansari et al., IEEE Trans. Acoust., Speech Sig. Proc. vol. ASSP-31, No. 6, pp. 1366-1373, Dec. 1983.

"Digital Signal Processing Schemes for Efficient Interpolation and Decimation", by R. A. Valanzuala et al., reported in IEEE Proc., vol. 130, No. 6, pp. 225-234, Dec. 1983.

Primary Examiner—Gary V. Harkcom
Assistant Examiner—Long T. Nguyen
Attorney, Agent, or Firm—Fleit, Jacobson, Cohn, Price, Holman & Stern

[57] ABSTRACT

A filter structure including a notch filter is designed to have a transmission zero at a frequency slightly displaced from one half of the lower sampling rate of the interpolator/decimator, and thus providing increase in attenuation at the half-rate frequency. The notch filter is comprised of two like all-pass-network filters and has feed forward and feedback connections, the latter connection including a coefficient multiplier. The feedback connection is made between a tapped output of the second of the network filters and an input node. The tapped filter is characterized by throughput and a tapped output transform functions X(Z) and Y(Z) given by the following expressions:

$$X(Z)=[Z^{-1}-K]/[1-KZ^{-1}]; \text{ and,}$$

$$Y(Z)=\alpha Z^{-1}/[1-KZ^{-1}];$$

where $Z^{-1}$ is the unit delay operator, K the multiplier coefficient and, $\alpha$, a structure dependant constant.

7 Claims, 3 Drawing Sheets

INTERPOLATOR/DECIMATOR FILTER STRUCTURE AND A NOTCH FILTER THEREFOR

BACKGROUND OF THE INVENTION

1. Field of the Invention

The present invention concerns improvements in or relating to interrnpolator and decimator filter structures of the type incorporating recursive digital filters. The invention also concerns the design of notch filters for use in such structures.

2. Related Art

Novel forms of interpolator/decimator filter structure have been described recently in the literature. In particular, reference is made to the two articles: "Digital Signal Processing Schemes for efficient interpolation and Decimation" by R. A. Valanzuala and A. G. Constantinides, reported in IEE. Proc. Vol. 130 No. 6 pp. 225-234 (Dec. 1983); and, "Efficient Sampling Rate alteration using Recursive (IIR) Digital Filters" by R. Ansari and B. Lui, reported in IEEE Trans Acoust., Speech Sig Proc. Vol.ASSP-31 No. 6 pp. 1366-1373 (Dec. 1983).

The structures described are capable of interpolating or decimating between two sampling rates related by a factor N where N is an integer. It proves most advantageous when N is 2, and it is this case that is considered further. It should be noted that Interpolation and Decimation between sampling rates differing by a factor of a power of two is easily implemented by a cascade of similar filters, each changing the frequency by a factor of two.

Important properties of these interpolator and decimator filter structures are as follows:

(i) The repeated use of simple All-Pass-Networks (APNs) to build up the filter structure, facilitating implementation, –

(ii) Most of the signal processing is performed at the lower of the two sampling frequencies, reducing the number of multiplications and additions required per unit time to achieve a given performance requirement compared to alternative filter structures, (iii) Good noise performance, (iv) Low sensitivity of filter performance to coefficient value, resulting in short wordlength co-efficients, (v) Reduced number of co-efficients required to implement a filter with given performance compared to alternative conventional filter structures.

However, there are some limitations to the performance of the filter structures as currently described in the literature. In particular such filter structures are incapable of providing more than 3 dB of attenuation at half of the lower sampling frequencies. There are many applications where there is a requirement for more than 3 dB attenuation.

SUMMARY OF THE INVENTION

The present invention is intended as a solution to the problem of providing in excess of 3 dB attenuation at one half of the lower sampling frequency. Interpolator and Decimator filter structures are provided wherein this problem is overcome by introducing a notch filter. This filter, which operates at the lower of the two sampling frequencies, introduces a transmission zero at some frequency slightly less than half of the lower sampling frequency and considerably more than 3 dB attenuation at half the lower sampling frequency.

In accordance with the invention there is provided an interpolator-or-decimator filter structure, operable between a lower and a higher sampling rate, comprising: an interpolating or decimating switched branched network, including one or more all-pass-network filters; and, connected in series therewith, a notch filter, this filter having a transmission zero at a frequency displaced from a frequency of one half of the lower sampling rate, and being comprised of a plurality of all-pass-network filters;

each all pass network filter including a delay element and at least one coefficient multiplier and having as characteristic a transform function X(Z) of the form:

$$X(Z)=[Z^{-1}-K]/[1-KZ^{-1}]$$

where $Z^{-1}$ is the unit delay operator and K the multiplier coefficient.

In accord with the invention there is also provided a notch filter for use in the interpolator/decimator filter structure as set forth above, the notch filter comprising:

A pair of all-pass-network filters connected in-line between an input node and an output node, the input to the first one of the pair of filters being connected to the output node, and a tapped output of the second one of these filters being connected to the input node, and wherein each all-pass-network filter is defined by a throughput transform function X(Z):

$$X(Z)=[Z^{-1}-K]/[1-KZ^{-1}],$$

and wherein the second of these filters has an intermediate transform function Y(Z):

$$Y(Z)=\alpha Z^{-1}/[1-KZ^{-1}];$$

where $\alpha$ is a structure constant.

BRIEF DESCRIPTION OF THE DRAWINGS

In the drawings accompanying this specification.

DESCRIPTION OF THE PREFERRED EMBODIMENT

Embodiments of this invention will now be described, by way of example only, and with particular reference to the drawings aforesaid.

Figure 1:
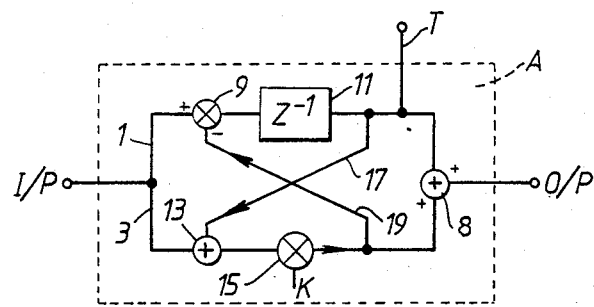
FIGS. 1 and 2 are circuit diagrams of alternative all-pass-network filters, each of known configuration, each suitable for application to the construction of interpolator/decimator filter structures.

An all-pass-network filter A of known configuration is shown in FIG. 1. This filter has two branches 1 and 3 each providing a connection between a common input terminal 5 and an output node 7. One branch, branch 1, includes a branch node 9 and a delay element 11. The other branch, branch 3, includes a branch node 13 and a coefficient multiplier 15. Output O/P is taken from the output node 7 and an intermediate output-T is taken from the signal path between this output node 7 and the delay element 11. Cross-connections 17 and 19 are provided between the output of the delay element 11 and the branch node 13 preceding the multiplier 15, and between the output of the multiplier 15 and the branch node 9 preceding the delay element 11, respectively.

Figure 2:
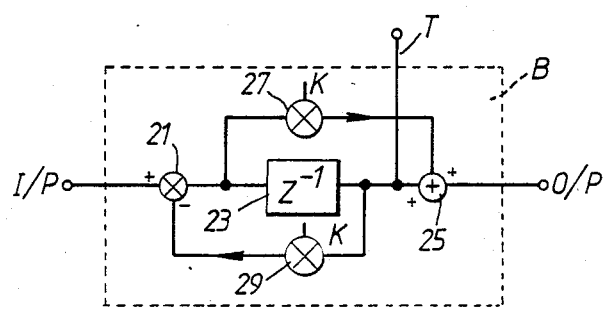

An alternative to the above all-pass-network is shown in FIG. 2. This network filter B comprises an input node 21, a delay element 23 and an output node 25, connected in-line. A first coefficient multiplier 27 is connected across the delay element 23 and this provides a feed forward path between the input to this element 23 and the output node 25. A second coefficient multiplier 29 is also connected across the delay element 23 and this provides a feedback path between the output of the delay element 23 and the input node 21. Output O/P is taken from the output node 25 and an intermediate output-T is taken from the signal path between the delay element 23 and the output node 25.

Either one of the filters, filter A or filter B, may be used in the construction of the notch filter and the interpolator/decimator filter structures shown in the following figures. For a particular application, the choice of all-pass-network filter will depend on the overall filter noise performance required, the signal growth tolerances at internal nodes and upon other implementation considerations.

The throughput and intermediate transform functions $X(Z)$ and $Y(Z)$ of both the filters, filter A and filter B, may be expressed as follows:

$$X(Z) = [Z^{-1} - K]/[1 - KZ^{-1}]: \text{ and,}$$

$$Y(Z) = \alpha Z^{-1}/[1 - KZ^{-1}],$$

where the term $\alpha$ is a structure constant, dependant thus on the particular configuration, and the term K is the multiplier coefficient.

Figure 3:
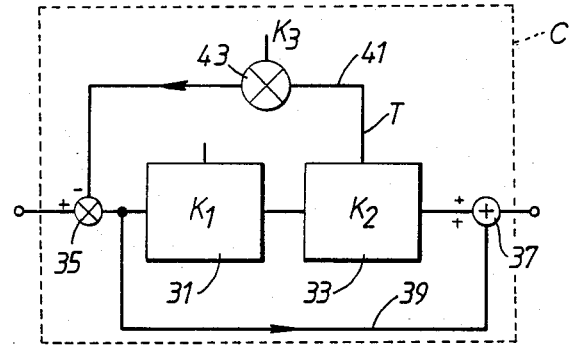
FIG. 3 is a block circuit diagram of a notch filter, constructed in accordance with this invention, and using a combination of filters of the type shown in either one of the preceding figures.

The notch filter C shown in FIG. 3 includes two like all-pass-network filters 31, 33 each constructed as described above. These two filters 31 and 33 are connected in-line between an input node 35 and an output node 37. A by-pass feed forward connection 39 is made between the input to the first one 31 of these two filters 31 and 33 and the output node 37. A negative feedback path 41 is made from the intermediate output T of the second one 33 of these two filters 31 and 33 to the input node 35. This path 41 includes a coefficient multiplier 43. In the figure, the labels $K_1$, $K_2$, $K_3$ denote multiplier coefficients for the two filters 31 and 33 and the multiplier 43. These coefficients $K_1$, $K_2$, $K_3$ determine the frequency response, and these can be optimised to meet a given requirement.

Figure 4:
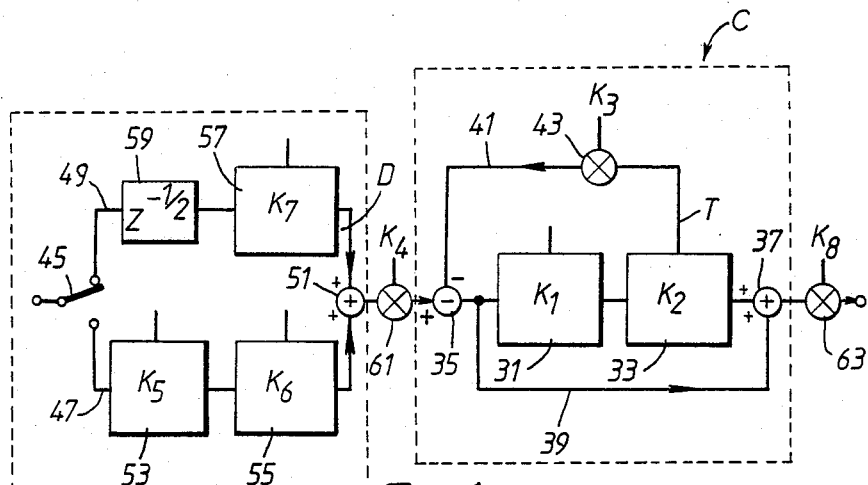
FIGS. 4 and 5 are block circuit diagrams of a decimator filter structure and an interpolator filter structure, respectively, each incorporating the notch filter shown in FIG. 3 above; and, FIGS. 6 and 7 are graphs of gain-frequency response for an interpolator/decimator structure and a notch filter, respectively.

This notch filter C is incorporated in the decimator structure shown in FIG. 4. The first stage of this structure comprises a sampling switch 45 which alternates between two branches 47 and 49 of the structure, each of which terminates at an output node 51. One branch 47 of this structure comprises a pair of like all-pass-network filters 53 and 55. Each has one of the forms described previously. The other branch 49 of the structure includes another like all-pass-network filter 57. This branch of the structure may also include a delay element 59. This stage of the structure performs the decimator function as described in the references quoted previously. A filter designed for a specific requirement is shown. However, further all-pass-networks may be introduced in each of the two branches 47 and 49 and the values of multiplier coefficients preset to meet alternative requirements. This first stage is followed by a divide-by-two multiplier 61, the notch filter C and one further divide-by-two multiplier 63. The latter pair of divide-by-two multiplier 61 and 63 are employed to reduce the signal amplitude to an acceptable level. In the figure, labels $K_4$ to $K_8$ denote the multiplier coefficients of the first divide-by-two multiplier 61, the three all-pass-network filters 53, 55 and 57, and the second divide-by-two multiplier 63, respectively.

Figure 6:
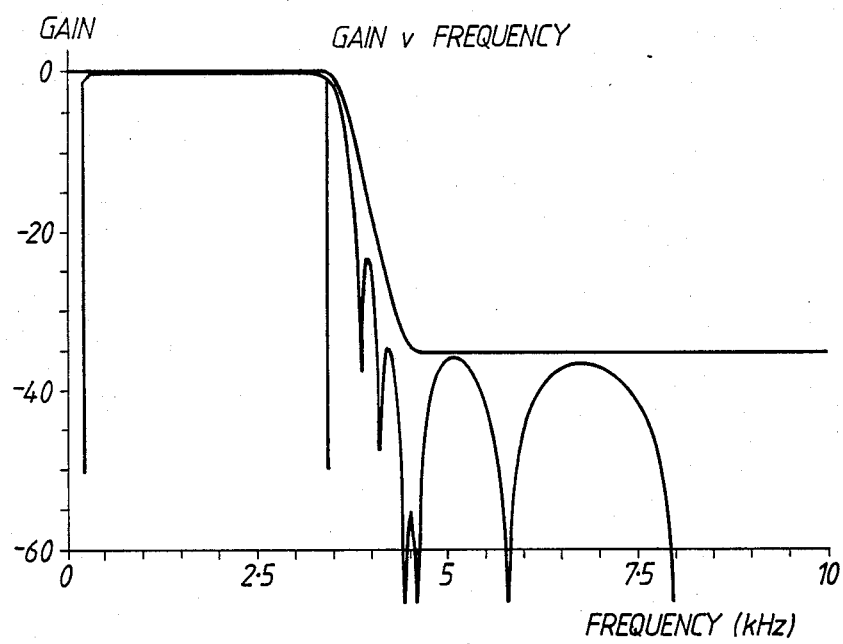

FIG. 6 shows a typical attenuation requirement for a decimator or interpolator, one that operates between a 16 Hz sampling rate and an 8 Hz sampling rate.

This may be compared with the response of the decimator also shown. The values of the coefficients $K_1$ to $K_8$, used in structure on which this response is based, are tabulated in the table below:

TABLE 1

| Coefficient | Decimal Equiv. Value | Fractional Value | Binary Value |
|---|---|---|---|
| $K_1$ | 0.5 | ½ | 0.100000 |
| $K_2$ | 0.984375 | 63/64 | 0.111111 |
| $K_3$ (A) | 10.75 | 10¾ | 1010.11 |
| $K_3$ (B) | 0.16796875 | 43/256 | 0.00101011 |
| $K_4$ | 0.5 | ½ | 0.100000 |
| $K_5$ | 0.21875 | 7/32 | 0.001110 |
| $K_6$ | 0.875 | ⅞ | 0.111000 |
| $K_7$ | 0.59375 | 19/32 | 0.100110 |
| $K_8$ | 0.5 | ½ | 0.100000 |

Figure 7:
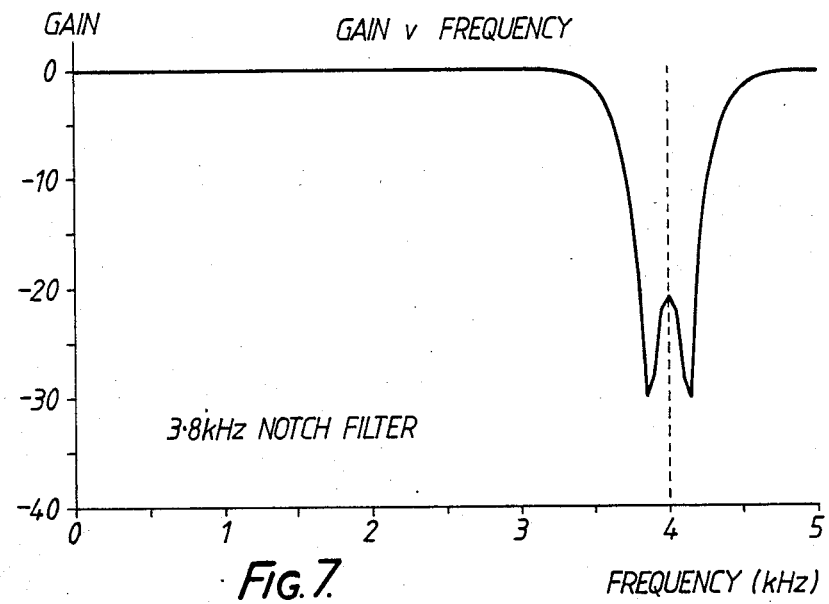

It can be seen from the table that only the coefficient $K_3$, the coefficient of the feedback multiplier 43 of the notch filter C, need differ for the alternative filter APN implementations A and B. The gain-frequency response of the notch filter C is shown in FIG. 7. This has a notch at a frequency of 3.8 kHz and a second notch, equi-spaced from the centre frequency 4 Hz (one half of the lower sampling rate 8 Hz), at a frequency of 4.2 kHz. The effect of this filter C can be clearly seen in the structure response curve shown in FIG. 6.

Figure 5:
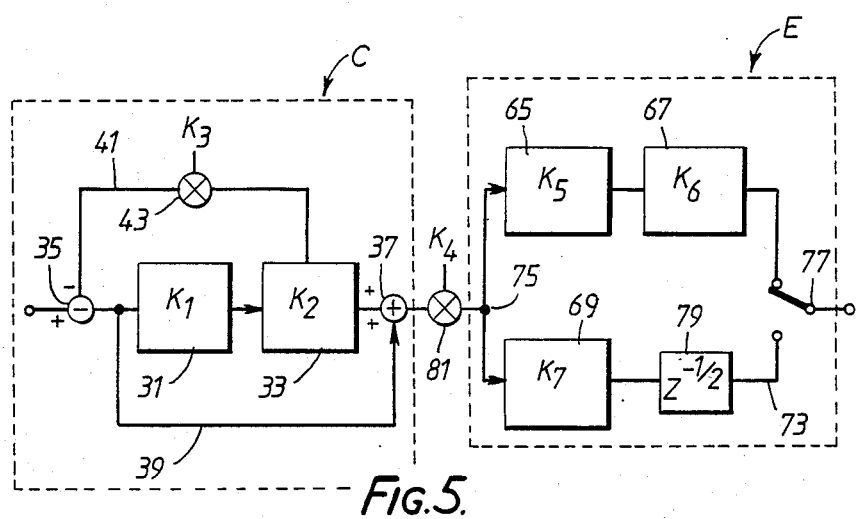

The notch filter C can also be used as part of an interpolator filter structure. This is shown in FIG. 5 where the notch filter C is used as the input stage to an interpolating sub-filter E. This latter comprises three all-pass-network filters 65, 67 and 69. These are arranged in two branches 71 and 73 extending between a common input junction 75 and a sampling switch 77. This last stage of the structure is similar to that described in the articles quoted. A delay element 79 may be included in the lower branch 73. The notch filter C and the interpolating sub-filter E are linked by a divide-by-two coefficient multiplier 81. In this figure the labels $K_4$ to $K_7$ denote the multiplier coefficients of the linking multiplier 81 and the three filters 65, 67 and 69. Typical values of the coefficients $K_1$ to $K_7$ are as tabulated above.

I claim:

1. A filter structure, operable between a lower and a higher sampling rate comprising:
   a switched branched network, having at least two branches including one or more all-pass-network filters, said switched branched network connected in series with a notch filter having a transmission zero at a frequency displaced from a frequency of one half of the lower sampling rate, said notch filter being comprised of a plurality of all-pass-network filters;
   each all-pass-network filter including a delay element and at least one coefficient multiplier and having as a characteristic a transform function X(Z) of the form:

$$X(Z)=(Z^{-1}-K)/(1-KZ^{-1})$$

where $Z^1$ is the unit delay operator and K is the multiplier coefficient.

2. A filter structure, as claimed in claim 1, wherein the notch filter comprises:
 a pair of all-pass-network filters connected in-line between an input node and an output node, an input to the first one of the pair of filters being connected to the output node, and a tapped output of the second one of these filters being connected to the input node, and wherein each all-pass-network filter is defined by a throughout transform function X(Z):

$$X(Z)=(Z^{-1}K)/(1-KZ^{-1}),$$

and wherein the second of these filters has an intermediate transform function Y(Z):

$$Y(Z) = \alpha Z^{-1}/(1-KZ^{-1}) \text{ where } \alpha \text{ is a structure constant.}$$

3. A filter structure, as claimed in claim 2, wherein each all-pass-network filter comprises a delay element and a coefficient multiplier, each in a respective branch of the switched branched network and disposed between a common input terminal and an output node; branch nodes being located between the input terminal and the delay element and multiplier, these being cross-coupled to the outputs of the multiplier and delay element, respectively.

4. A filter structure, as claimed in claim 2, wherein each all-pass-network filter comprises a delay element in-line between an input node and an output node, there being a feedback connection between the output of the delay element and the input node, and, a feed forward connection between the input to the delay element and the output node, each connection including a like coefficient multiplier.

5. A notch filter, for use in a filter structure, said notch filter comprising:
 a pair of all-pass-network filters having a plurality of branches connected in-line between an input node and an output node, an input to the first one of the pair of filters being connected to the output node, and a tapped output of the second one of these filters being connected to the input node, and wherein transform function X(Z):

$$X(Z)=(Z^{-1}K)/(1-KZ^{-1}),$$

and wherein the second of these filters has an intermediate transform function Y(Z):

$$Y(Z)=\alpha Z^{-1}/(1-KZ^{-1})$$

where $\alpha$ is a structure constant.

6. A notch filter, as claimed in claim 5, wherein each all-pass-network filter comprises a delay element and a coefficient multiplier, each in a respective branch of the network filter and, disposed between a common input terminal and an output node; branch nodes being located between the input terminal and the delay element and multiplier, these being cross-coupled to the outputs of the multiplier and delay element, respectively.

7. A notch filter, as claimed in claim 5, wherein each all-pass-network filter comprises a delay element in-line between an input node and an output node, there being a feedback connection between the output of the delay element and the input node, and, a feed forward connection between the input to the delay element and the output node, each connection including a like coefficient multiplier.

* * * * *